(12) United States Patent
Noro

(10) Patent No.: US 6,703,958 B2
(45) Date of Patent: Mar. 9, 2004

(54) ANALOG-TO-DIGITAL CONVERTER

(75) Inventor: Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/870,153

(22) Filed: May 30, 2001

(65) Prior Publication Data

US 2001/0048384 A1 Dec. 6, 2001

(30) Foreign Application Priority Data

May 30, 2000 (JP) ........................................ 2000-160896

(51) Int. Cl.$^7$ ................................................ H03M 1/12
(52) U.S. Cl. ...................... 341/155; 341/126; 341/144; 341/145
(58) Field of Search ................................ 341/143, 155, 341/156, 144, 145, 166, 110, 115–118, 126

(56) References Cited

U.S. PATENT DOCUMENTS

| 4,296,412 A | * | 10/1981 | Mastner | 340/870.19 |
| 4,721,865 A | * | 1/1988 | Tallaron et al. | 307/350 |
| 4,876,544 A | * | 10/1989 | Kuraishi | 341/166 |
| 4,990,914 A | * | 2/1991 | Giancarlo | 341/143 |
| 5,459,319 A | * | 10/1995 | Norsworthy | 250/349 |
| 5,526,339 A | * | 6/1996 | Shimada | 369/124 |
| 5,592,508 A | * | 1/1997 | Cooper | 375/216 |
| 5,675,340 A | * | 10/1997 | Hester et al. | 341/156 |
| RE36,933 E | * | 10/2000 | Shimada | 369/59 |

FOREIGN PATENT DOCUMENTS

| JP | 06 097829 | 9/1979 |
| JP | 54 123862 | 8/1998 |

* cited by examiner

Primary Examiner—Brian Young
Assistant Examiner—John Nguyen
(74) Attorney, Agent, or Firm—Pillsbury Winthrop LLP

(57) ABSTRACT

A highly efficient analog-to-digital (A/D) converter circuit that converts an external analog signal sequentially generated from an external analog signal source into an n-bit digital data signal (n is an integer equal to or more than two) includes a digital-to-analog (D/A) converter circuit that converts an n-bit digital data signal into an analog signal and outputting the analog signal from a first output terminal, a comparator that compares a signal level of an external analog signal supplied from an external device with a signal level of the analog signal outputted from the first output terminal, and a digital integrator circuit that digitally integrates a 1-bit digital data signal outputted from the comparator and thereby producing an n-bit digital data signal.

7 Claims, 6 Drawing Sheets

ANALOG-TO-DIGITAL CONVERTER

This application is based on Japanese Patent Application 2000-160896, filed on May 30, all of the content of which is incorporated in this application by reference.

BACKGROUND OF THE INVENTION

1. Field of the Invention

The present invention relates to an analog-to-digital (A/D) converter circuit, and in particular, to a highly efficient A/D converter circuit suitable to process audio signals.

2. Description of the Related Art

In the prior art, the highly efficient A/D converter circuits of this kind include an A/D converter of sequential comparison type and over-sampling-type A/D converters such as an A/D converter of Δ modification and an A/D converter of Δ Σ modification. FIG. 4 shows an A/D converter of sequential comparison type. The A/D converter includes a sample-and-hold (S/H) circuit 40, a digital-to-analog (D/A) converter circuit (DAC) 42, a sequential-comparison register 44, and a comparator 46 to compare an output signal from the sample-and-hold circuit 40 and an analog output signal from the D/A converter 42.

In the A/D converter circuit of sequential comparison type, an analog signal is inputted via an input terminal 100 to be held by the S/H circuit 40. On the other hand, an output signal from the sequential-comparison register 44 is fed to the DAC 42 to set its most-significant bit (MSB) to one, i.e., MSB=1. Thereafter, the comparator 46 compares the output signal from the DAC 42 with that from the S/H circuit 40. If the output signal from the DAC 42 is larger than that from the S/H circuit 40, the MSB is fixed to one (MSB=1). If the output signal from the DAC 42 is smaller than that from the S/H circuit 40, the MSB is fixed to zero (MSB=0). Resultantly, the first bit of the output signal from DAC 42 is determined. The comparator 46 continuously and repeatedly conducts the comparing operation for the output from the DAC 42 up to its least-significant bit (LSB). When the output signal from the S/H circuit 40 equals to that from the DAC 42, the digital output from the sequential-comparison register 44 operating in association with the DAC 42 is determined as the output from the A/D converter of sequential comparison type.

FIG. 5 shows, as a highly efficient A/D converter circuit of over-sampling type, constitution of an A/D converter of Δ modification of the prior art. The A/D converter circuit of FIG. 5 includes a comparator 50 which compares a reference voltage (a ground voltage in FIG. 5) with an output voltage from an adder circuit 52 to produce 1-bit digital data according to a result of the comparison, a D/A converter circuit 54 to receive the 1-bit digital data from the comparator 50, an analog integrator circuit 56 to integrate an analog output from the DAC 54, an inverter circuit 57 to invert a result of the integration from the analog integrator 56, and an adder circuit 52 to add an analog voltage signal inputted from an input terminal 101 to an inverted output signal from the inverter 57.

The A/D converter of Δ modification outputs 1-bit digital data of "1" or "0" depending on a result of comparison in the comparator 50, namely, depending on whether or not the reference voltage is higher than the output signal from the adder 52. The D/A converter 54 converts the 1-bit digital data into an analog signal. The analog integrator 56 integrates the analog signal and sends the integrated signal to the inverter 57. The inverter 57 inverts the integrated signal to produce an inverted signal. The adder 52 adds the inverted signal to the analog voltage signal inputted from the input terminal 101. The comparator 50 compares the sum signal resultant from the addition with the reference voltage. Until the analog input voltage from the input terminal 101 matches in a signal level with the output signal from the analog integrator 56, the comparator 50 repeatedly conducts the comparing operation. The 1-bit digital data sequentially outputted from the comparator 50 constitutes the converted output signal from the A/D converter of Δ modification.

FIG. 6 shows, as a highly efficient A/D converter circuit of over-sampling type, constitution of an A/D converter of Δ Σ modification of the prior art. The A/D converter circuit of FIG. 6 includes a comparator 60 which compares a reference voltage (a ground voltage in FIG. 6) with an output voltage from an analog integrator circuit 66 to produce 1-bit digital data according to a result of the comparison, a DAC circuit 62 to receive the 1-bit digital data from the comparator 60 to convert the data into analog data, an inverter circuit 63 to invert an analog output from the DAC 62, an adder circuit 64 to add an analog voltage inputted from an input terminal 103 to an inverted output from the inverter 63, and an analog integrator circuit 66 to integrate an output signal from the adder 64.

In the A/D converter of Δ Σ modification, the adder 64 adds the analog voltage inputted from the input terminal 103 to the inverted output from the inverter 63. The analog integrator 66 integrates a sum signal resultant from the addition. The comparator 60 compares the integrated output signal from the analog integrator 66 with the reference voltage signal. According to a result of the comparison, 1-bit digital data is outputted to an output terminal 104 and the DAC 62.

The DAC 62 converts the 1-bit digital data into an analog voltage. The inverter 63 inverts the integrated analog voltage to obtain an inverted signal. The adder 64 adds the inverted output signal to the analog voltage signal inputted from the input terminal 103. A signal resultant from the addition is inputted to the analog integrator 66.

Until the reference voltage matches in a signal level with the output signal from the analog integrator 66, the comparator 60 repeatedly conducts the comparing operation. The 1-bit digital data sequentially outputted from the comparator 60 constitutes the converted output from the A/D converter of Δ Σ modification.

The A/D converter of sequential comparison required a sample-and-hold circuit. When such an A/D converter operates, for example, with a sampling frequency of 192 KHz to produce a 24-bit digital signal. It is necessary to conduct the sample-and-hold operation within $1/192 \times 10^3 =$ 5.2 microseconds ($\mu$s) and 24 sequential comparing operations within the same period of time. That is, there is required an A/D converter which produces a 24-bit output signal and which has a settling time of about 100 nanoseconds (ns). Such a circuit cannot be easily constructed.

Additionally, in the A/D converter of sequential comparison, the comparator compares the input analog voltage with the voltage about a half of the full-scale voltage of the D/A converter (the voltage value indicated by a bit corresponding to the MSB of the D/A converter) beginning at the MSB. Therefore, when resolution is increased, a monotonous feature is lost in the neighborhood of "full-scale-voltage/2 (center potential)" or a code loss easily occurs. This consequently results in a problem that a highly efficient A/D converter of sequential comparison cannot be easily produced.

The over-sampling-type A/D converter such as an A/D converter of Δ modification or an A/D converter of Δ Σ modification uses an analog integrator circuit. Therefore, to obtain a high signal-to-noise (S/N) ratio, large capacitor is required in the large-scale integrated (LSI) circuit of the converter. This leads to a problem. That is, to form such large capacitor, the LSI circuit becomes great in size. Furthermore, to improve efficiency of the converter, there arises a problem that an over-sampling clock signal with a high frequency is required.

Additionally, in an A/D converter of Δ modification or an A/D converter of Δ Σ modification, it is difficult to obtain a dynamic range or a signal-to-noise ratio equal to or more than 120 dB. Since an analog integrator circuit is employed as an integrator circuit in the A/D converter circuit, it is difficult to conduct a multi-channel A/D conversion using time division.

Although recent high-performance audio apparatuses require 24-bit A/D conversion, the A/D converter circuits of the prior art cannot conduct A/D conversion with a precision of 24 bits.

SUMMARY OF THE INVENTION

It is therefore an object of the present invention to provide a high-performance A/D converter circuit for audio apparatuses to thereby remove the difficulties above. 1.

To achieve the object according to the present invention, there is provided, an analog-to-digital (A/D) converter circuit that converts an external analog signal sequentially generated from an external analog signal source into an n-bit digital data signal (n is an integer equal to or more than two), comprising, a digital-to-analog (D/A) converter circuit that converts an n-bit digital data signal into an analog signal and outputting the analog signal from a first output terminal, a comparator that compares a signal level of an external analog signal supplied from an external device with a signal level of the analog signal outputted from the first output terminal, and a digital integrator circuit that digitally integrates a 1-bit digital data signal outputted from said comparator and thereby producing an n-bit digital data signal.

It is therefore possible to conduct an analog-to-digital conversion with a high resolution of 24 bits using a low over-sampling rate (similar to that of the prior art).

Since the A/D converter circuit according to the present invention is a converter of a feedback type, it is possible to prevent deterioration in the monotonous feature, which is a problem of the A/D converter circuit of sequential comparison.

According to the present invention, a digital integrator circuit is used as an integrator circuit of the A/D converter circuit and hence an analog integrator circuit is not required. Therefore, the capacity described above is not required and hence there can be obtained an A/D converter circuit suitable for an LSI circuit.

Since the A/D conversion is carried out using a digital integrator circuit, it is possible to conduct a multichannel A/D conversion using time division.

Since the A/D converter circuit in an embodiment of the present invention is a converter of a feedback type, it is possible to prevent deterioration in the monotonous feature, which is a problem of the A/D converter circuit of sequential comparison.

Since a digital integrator circuit is used as an integrator circuit of the A/D converter circuit in an embodiment of the present invention, an analog integrator circuit is not required and the capacity is not required. Consequently, there can be obtained an A/D converter circuit suitable for an LSI circuit.

Since the A/D conversion is carried out using a digital integrator circuit in an embodiment of the present invention, it is possible to conduct a multi-channel A/D conversion using time division.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
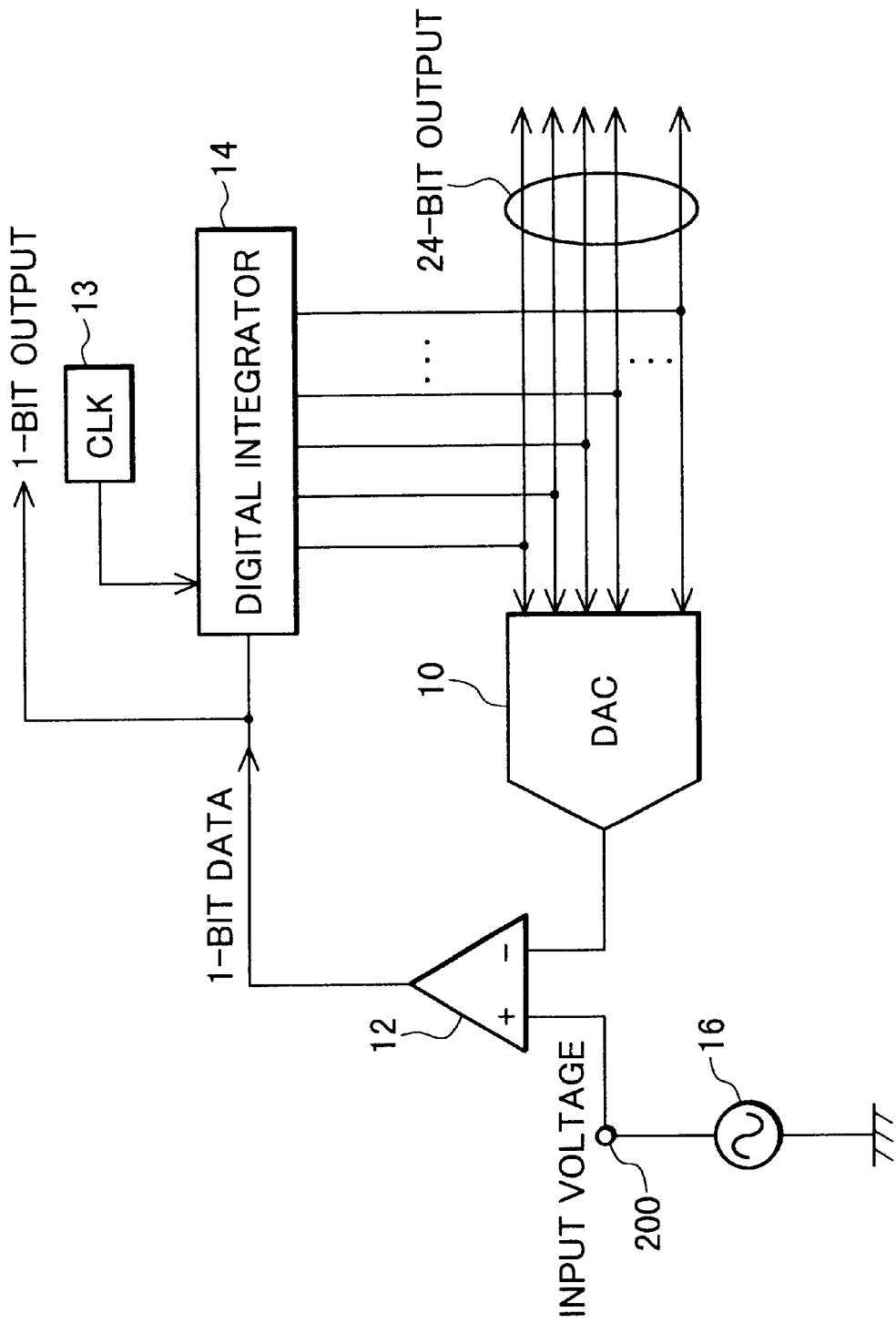
FIG. 1 is a diagram schematically showing constitution of an A/D converter circuit in an embodiment of the present invention.

Referring now to the accompanying drawings, description will be given in detail of an embodiment of the present invention. FIG. 1 shows a configuration of an A/D converter circuit in an embodiment of the present invention.

The A/D converter circuit includes a D/A converter circuit 10, a comparator 12, a digital integrator circuit 14, and a clock signal generator 13.

The DAC 10 receives a signal delivered from the digital integrator 14 and can convert an n-bit digital signal into an analog signal, where n is an integer equal to or more than two. In this example, n is 24, that is, a 24-bit digital signal is converted into an analog signal.

The comparator 12 compares an analog signal received via an input terminal 200 from a signal source 16 with an analog output signal from the DAC 10. According to a result of the comparison, the comparator 12 outputs 1-bit digital data.

The digital integrator 14 receives the 1-bit digital data from the comparator 12 and digitally integrates the data according to a synchronizing clock signal from the clock signal generator 13 to resultantly output an n-bit digital signal, where n is 24 in this example.

Operation of the A/D converter will be described in detail. Having received the analog signal from the signal source 16, the comparator 12 compares the analog signal with the analog output signal from the D/A converter 10. If a signal level of the analog input signal from the input terminal 200 is larger than that of the analog signal from the D/A converter 10, the comparator 12 outputs 1-bit data of "1" to the digital integrator 14. If the signal level of the analog input signal is larger than that of the analog signal from the D/A converter 10, the comparator 12 outputs 1-bit data of "0" to the digital integrator 14. The integrator 14 also receives a clock signal CLK from the clock signal generator 13.

The digital integrator 14 digitally integrates the 1-bit digital data, namely, adds the data to each other to produce n-bit digital data (n is 24 in this example). At timing synchronized with a clock signal CLK from the clock signal generator 13, the 24-bit digital data is fed to the DAC 10 and an external device.

Since the 1-bit output data can be output at a high frequency, the 1-bit output terminal can be connected to the input terminal of a device operated at high frequency, for example, SACD (Super Audio Compact Disk (CD)) player. It can also be used, for example, for a 1-bit power amplifier.

The 1-bit output data can be used, for example, for a 1-bit power amplifier.

The comparator 12 repeatedly conducts the comparison until the analog signal from the input terminal 200 matches the analog output signal from the DAC 10. When these signals match each other, a 24-bit digital output signal from the digital integrator 14 is obtained as a result of the analog-to-digital conversion of the analog input signal. The 24-bit data is acquired as output data from the A/D converter circuit.

Figure 2:
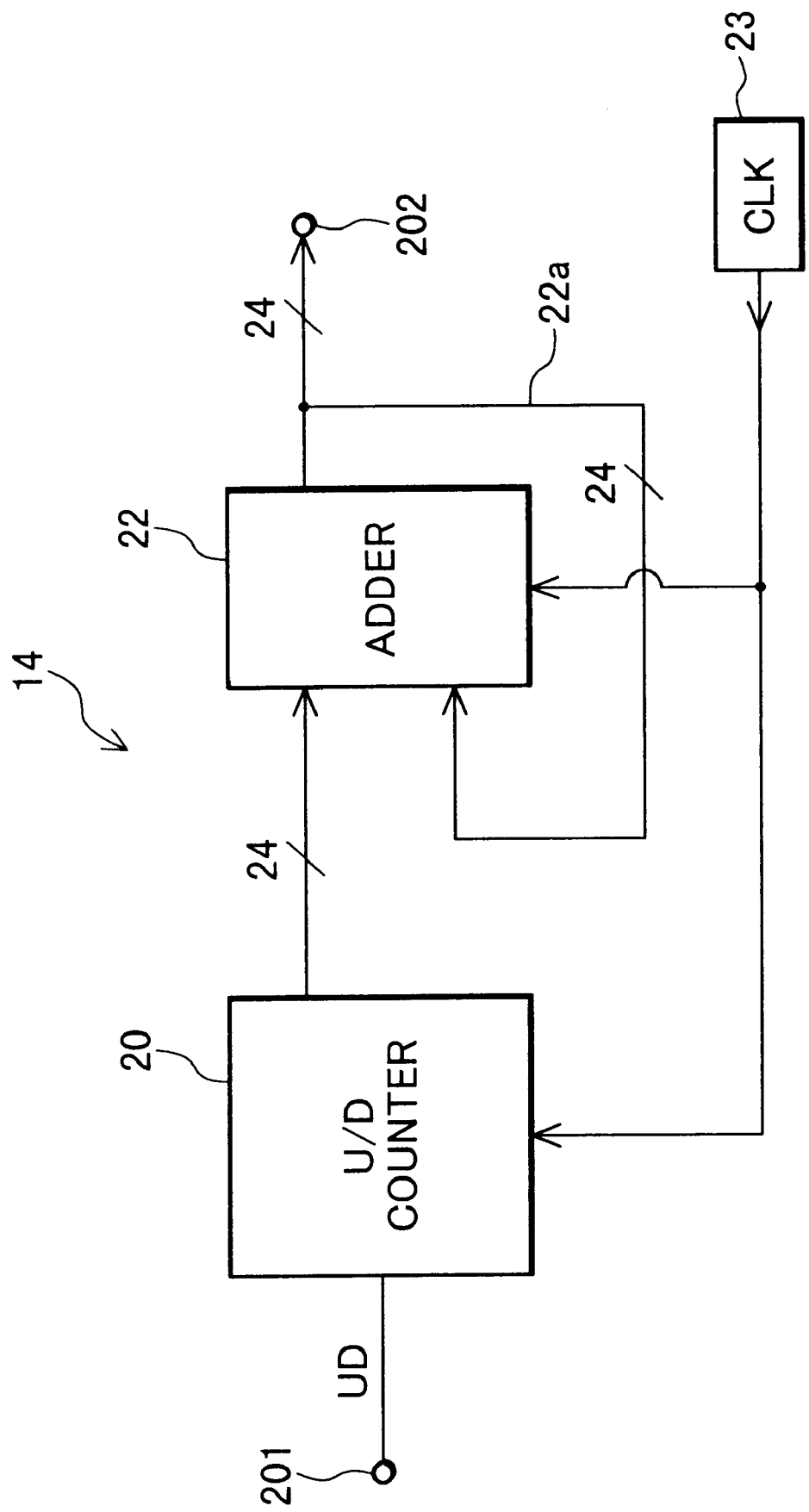
FIG. 2 is a diagram showing an example of a specific configuration of a digital integrator circuit in the A/D converter circuit shown in FIG. 1.

FIG. 2 shows an example of a specific configuration of the digital integrator circuit 14 of FIG. 1. The digital integrator 14 of FIG. 2 includes an up-down counter (U/D) 20, an adder 22, and a clock signal generator 23. The counter (U/D) 20 receives via an input terminal 201 (FIG. 1) the 1-bit digital data (up/down (U/D) signal) outputted from the comparator 12 shown in FIG. 1. The adder 22 has a feedback circuit 22a to add a count value produced from the counter 20 to a count value accumulated in the adder 22. In this connection, the clock signal generator 23 inputs a synchronizing signal to the counter 20 and the adder 22.

In the configuration, the counter 20 receives via the input terminal 201 the 1-bit digital data representing a result of the comparison between the input analog voltage from the comparator 12 shown in FIG. 1 and the analog output signal from the DAC 10. If the digital data is "1", the counter 20 adds one to the accumulated value. If the digital data is "0", the counter 20 subtracts one from the accumulated value.

At timing synchronized with the clock signal CLK from the clock signal generator 23, the counter 20 conducts the addition or the subtraction according to the 1-bit digital data received as above. A result of the count operation (including 24 bits) is outputted to the adder 22. In FIG. 2, a symbol of 24 with a slash therebelow means that the line represents a 24-bit signal line. This also applies to the other drawings. The output signal from the adder 22 is fed to an output terminal 202 and is also returned via the feedback circuit 22a to an input terminal thereof. The feedback circuit 22a supplies a result of the preceding addition to the adder 22. Therefore, in the adder 22, the count value from the counter 20 is added, in synchronism with the clock signal CLK, to the input representing the preceding addition thus supplied via the feedback circuit 22a to resultantly produce a 24-bit signal. The adder 22 outputs the 24-bit signal via the output terminal 202 to the D/A converter 10 of FIG. 1. The digital integration is achieved in this way.

Since the feedback circuit 22a is disposed for the adder 22, the output signal is obtained as an accumulation of the input signals.

Figure 3:
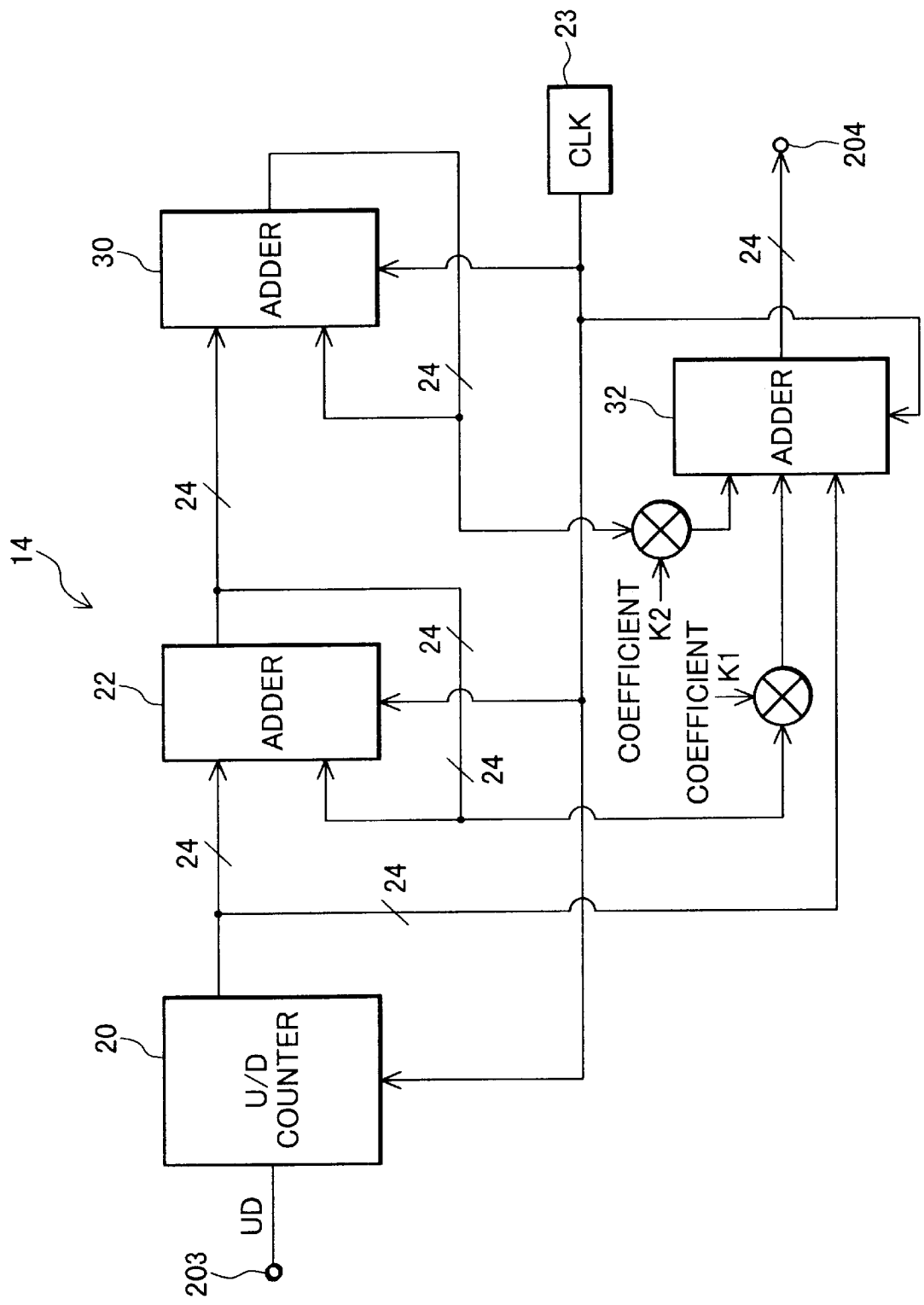
FIG. 3 is a block diagram showing another example of a specific configuration of a digital integrator circuit in the A/D converter circuit shown in FIG. 1.
Figure 4:
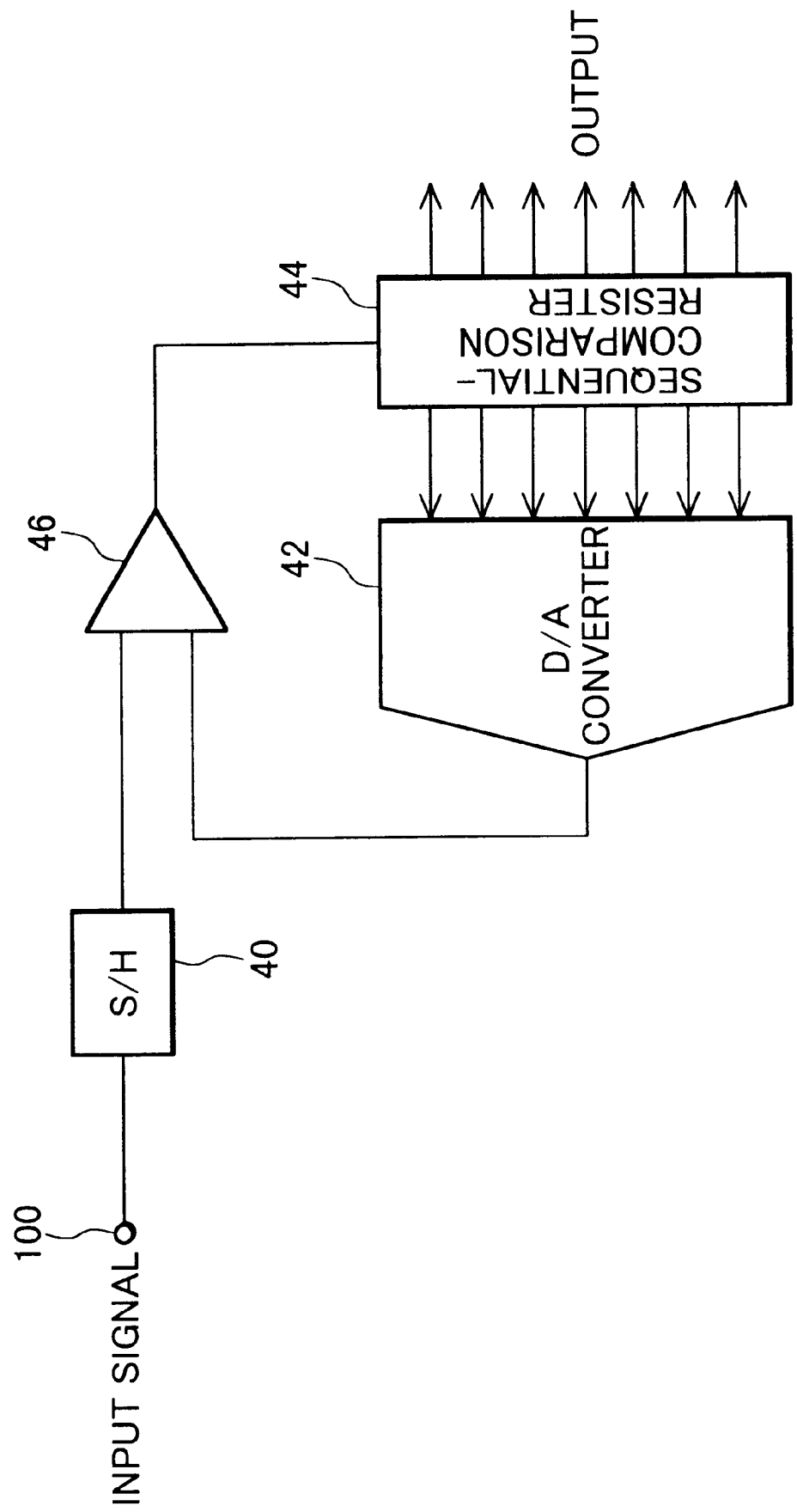
FIG. 4 is a block diagram showing structure of an S/D converter circuit of sequential comparison in the prior art.

Next, FIG. 3 shows another circuit configuration of the digital integrator circuit 14. This differs from FIG. 2 in that the circuit 14 of FIG. 3 includes three adders, namely, a first adder 22, a second adder 30, and a third adder 32. The second adder 30 receives a resultant signal of addition from the first adder 22 to conduct an addition for the signal. The third adder 32 receives output signals respectively from the counter 20, the first adder 22, and the second adder 30 with a predetermined ratio set between these signals. Specifically, coefficients K1 and K2 are respectively multiplied by the output signals respectively from the first and second adders 22 and 30.

Operation of the digital integrator 14 will be described. In the integrator 14 configured as above, the up-down counter 20 receives via an input terminal 203 1-bit digital data indicating "up" or "down" of the count in the counter 20 as a result of the comparison carried out by the comparator 12 of FIG. 1 between the analog input signal from an input terminal 203 and the analog output signal from the DAC 10.

The counter (U/D) 20 adds or subtracts one to or from the existing count value thereof according to the 1-bit digital data received from the clock signal generator 23 at timing synchronized with the clock signal CLK to produce a 24-bit resultant count value. The counter 20 outputs the value to the first and third adders 22 and 32. The first adder 22 adds the value from the counter 20 to the existing value thereof in synchronism with the clock signal CLK from the clock signal generator 23 to produce a value resultant from the addition. The first adder 22 outputs the value to the second and third adders 30 and 32.

The second adder 30 adds the value from the first adder 22 to the existing value thereof in synchronism with the clock signal CLK to produce a value resultant from the addition. The second adder 22 outputs the value to the third adder 32. At timing synchronized with the clock signal CLK, the third adder 32 adds the outputs respectively from the first and second adders 22 and 30 with a predetermined ratio between the coefficients K1 and K2 associated respectively with the outputs from the first adder 22 and that from the second adder 30 to produce a value resultant from the addition. The third adder 32 outputs the value to the DAC 10.

The first adder 22 outputs a least-significant bit (LSB). The second adder 30 outputs high-order bits. The third adder 32 outputs further high-order bits. When the addition is conducted using only the least-significant bit, there is required a long period of time for the processing. To minimize the processing time, the high-order bits are also used for the addition. The coefficients K1 and K2 need only be determined to have a ratio therebetween which can be represented, for example, by eight bits.

While the digital integrator 14 of FIG. 2 includes one adder to form a one-stage integrator, the digital integrator of FIG. 3 includes a plurality of adders to form a multi-stage integrator. Specifically, the digital integrator of FIG. 3 includes two adders 22 and 30 to digitally conduct a two-stage integration. Specifically, two adders 22 and 30 are used to conduct a digital two-stage integration. Therefore, when compared with the circuit configuration shown in FIG. 2, the circuit constitution shown in FIG. 3 is more advantageous in that the conversion time of the comparator 12 in minimized. That is, in a shorter period of time, the analog input signal from the input terminal 200 becomes substantially equal to the analog output signal from the DAC 10 in the circuit configuration of FIG. 3.

The DAC 10 receives the output signal from the digital integrator 14, and the digital output signal is at least either one the output signal from the comparator 12 and that from the digital integrator 14. Therefore, even if the oversampling rate is lowered, the ADC can operate with high efficiency.

Figure 5:
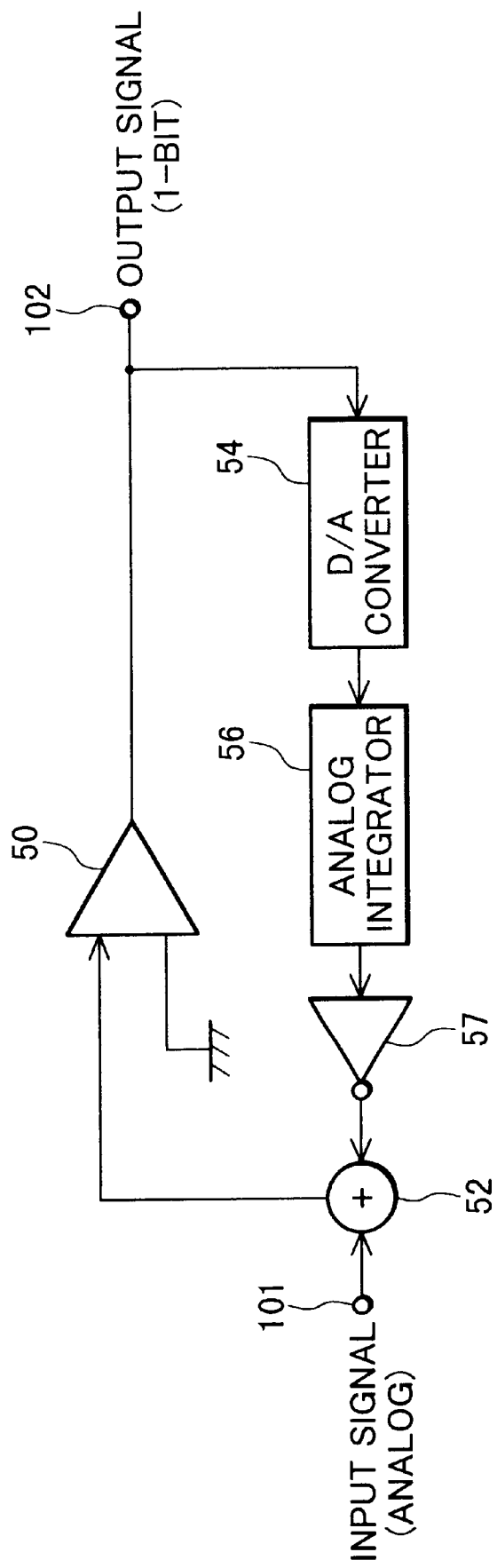
FIG. 5 is a block diagram showing structure of an S/D converter circuit of Δ modification in the prior art.
Figure 6:
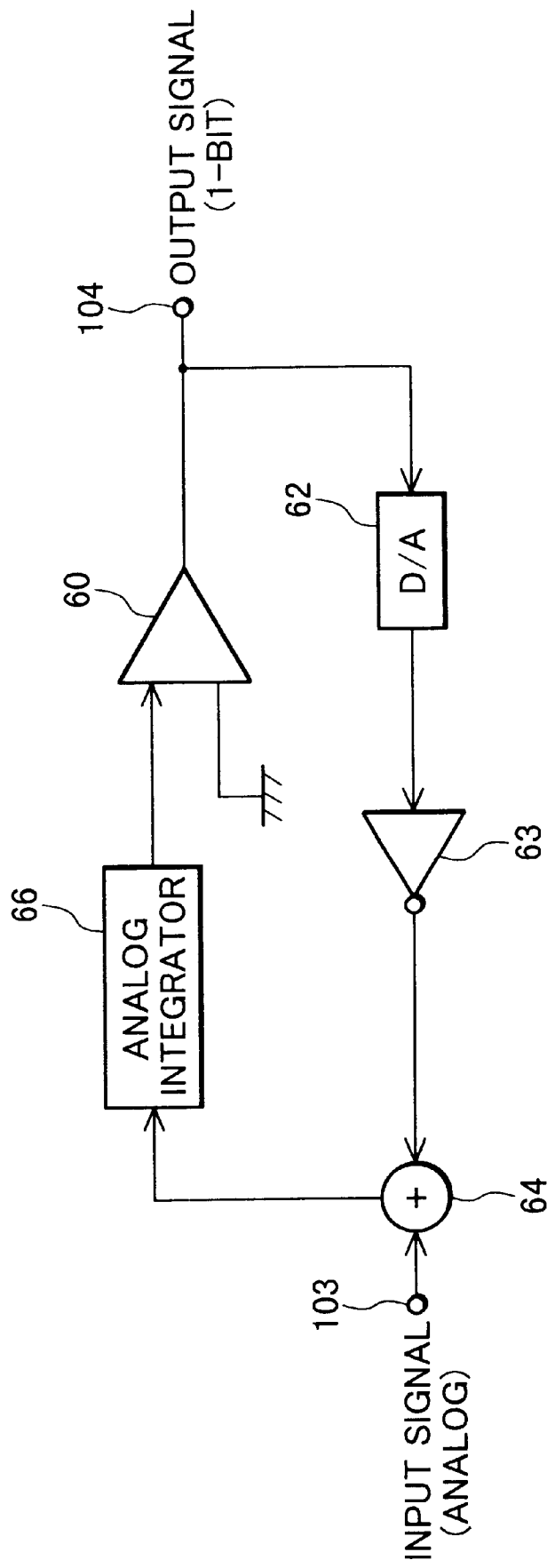
FIG. 6 is a block diagram showing structure of an S/D converter circuit of Δ Σ modification in the prior art.

As above, the A/D converter of Δ modification (FIG. 5) and the A/D converter of Δ Σ modification (FIG. 5) of the prior art has a resolution of 16 or 20 bits. Therefore, to obtain a resolution of 24 bits in the analog-to-digital conversion using such an A/D converter circuit of the prior art, the over-sampling rate of the prior art (for example, 128 sampling frequencies (fs) or 512 fs) must be increased. To change data of, for example, a 44.1 kHz sampling format to data of 1024 fs or 2048 fs, the clock signal must have a frequency of 45 MHz or 90 MHz. Additionally, for data of the digital video disk (DVD) audio format, the sampling frequency takes a high value such as 192 KHz or 96 KHz. It is necessary to conduct an over-sampling operation for the sampling frequency with the over-sampling rate of 1024 fs or 2048 fs. The clock signal must have a highest frequency of about 400 MHz. This is not practical. In the over-sampling rate of the ADC of the present invention, the comparator compares the input signal with the 24-bit output signal from the DAC 10 to produce a 1-bit output signal. The digital integrator integrates the 1-bit output signal to produce 24-bit data. The output from the digital-to-analog conversion includes 24 bits, not one bit. Therefore, using an over-sampling rate which is lower than the over-sampling rate described above of an ordinary A/D converter of Δ Σ modification and which is similar to that of the prior art, the A/D converter of the present invention can conduct the analog-to-digital conversion with a high resolution of 24 bits.

Since the A/D converter of the present invention uses a feedback operation, the deterioration of the monotonous feature, which disadvantageously takes place in the A/D converter of the sequential comparison can be presented.

In the A/D converter of the present invention, the integrator circuit of the A/D converter is a digital integrator circuit. Therefore, the analog integrator circuit used in the prior art is not required, and hence the associated capacity is not required. The A/D converter circuit can be suitably implemented in an LSI chip.

Since the digital integrator circuit is used to conduct the analog-to-digital conversion, it is possible to achieve a multi-channel analog-to-digital conversion using time division.

In the A/D converter circuit of the embodiments, the digital integrator circuits respectively have a 1-stage configuration (FIG. 2) and a multi-stage, specifically, two-stage configuration (FIG. 3). The present invention is not restricted by these embodiments. The digital integrator circuit may include three of more stages to achieve the object of the present invention.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An analog-to-digital (A/D) converter circuit that converts an external analog signal sequentially generated from an external analog signal source into an n-bit digital data signal (n being an integer equal to or more than two), comprising:
   a digital-to-analog (D/A) converter circuit that converts a prior n-bit digital data signal into an analog signal and outputs the analog signal from a first output terminal;
   a comparator that compares a signal level of an external analog signal supplied from an external device with a signal level of the analog signal outputted from the first output terminal; and
   a digital integrator circuit that digitally integrates a 1-bit digital data signal outputted from said comparator and thereby produces the prior n-bit digital data signal and outputs an n-bit digital data signal to an external device, wherein the comparator also outputs the 1-bit digital data signal via a second terminal, and
   said digital integrator circuit includes:
      an up-down counter that conducts an addition or a subtraction for a value thereof according to the 1-bit digital data signal outputted from said comparator and produces an n-bit count value, and
      an adder including a first input terminal, a second input terminal, and a third output terminal, the first input terminal receiving the n-bit count value from said up-down counter, the second input terminal receiving a prior n-bit value, the third output terminal outputting the n-bit digital data signal as a result of the addition of the first input terminal and the second input terminal.

2. An A/D converter circuit according to claim 1, further comprising a fourth output terminal connected to the second input terminal and the third output terminal that outputs an output signal including the n-bit digital data signal from said digital integrator circuit to an external device.

3. An analog-to-digital converter circuit that converts an external analog signal sequentially generated from an external analog signal source into an n-bit digital data signal (n is an integer equal to or more than two), comprising:
   a digital-to-analog (D/A) converter circuit that converts a prior n-bit digital data signal into an analog signal and outputs the analog signal from a first output terminal;
   a comparator that compares a signal level of an external analog signal supplied from an external device with a signal level of the analog signal outputted from the first output terminal;
   a digital integrator circuit that digitally integrates a 1-bit digital data signal outputted from said comparator and thereby produces the prior n-bit digital data signal and outputs an n-bit digital data signal to an external device, wherein the comparator also outputs the 1-bit digital data signal via a second terminal, said digital integrator circuit including,
      an up-down counter that conducts an addition or a subtraction for a value thereof according to the 1-bit digital data signal outputted from said comparator and produces an n-bit count value and
      an adder including a first input terminal, a second input terminal, and a third output terminal, the first input terminal receiving the n-bit count value from said up-down counter, the second input terminal receiving a prior n-bit value, the third output terminal outputting the n-bit output signal as a result of the addition of the first input terminal and the second input terminal,
   a clock signal generator that generates a clock pulse signal, the clock pulse signal being used to synchronize digital integration processing in said digital integrator circuit; and
   a first clock signal input terminal and a second clock signal input terminal respectively disposed in said up-down counter and said adder that receives the clock pulse signal from said clock signal generator, said first clock signal input terminal and said second clock signal input terminal receiving the clock pulse signal to execute count processing of said up-down counter and adding processing of said adder at timing synchronized with the clock pulse signal from said clock signal generator.

4. An analog-to-digital (A/D) converter circuit that converts an external analog signal sequentially generated from an external analog signal source into an n-bit digital data signal (n is an integer equal to or more than two), comprising:
- a digital-to-analog (D/A) converter circuit that converts a prior n-bit digital data signal into an analog signal and outputs the analog signal from a first output terminal;
- a comparator that compares a signal level of an external analog signal supplied from an external device with a signal level of the analog signal outputted from the first output terminal; and
- a digital integrator circuit that digitally integrates a 1-bit digital data signal outputted from said comparator and thereby produces the n-bit digital data signal, wherein, said digital integrator circuit including:
    - an up-down counter that conducts an addition or a subtraction for a value thereof according to the 1-bit digital data signal outputted from said comparator and producing an n-bit count value,
    - a first adder that adds the n-bit count value from said up-down counter to a first adder prior n-bit value and outputs a first resultant value of the addition,
    - a second adder that adds the first resultant value from said first adder to a second adder n-bit prior value and outputs a second resultant value of the addition, and
    - a third adder that adds to each other the n-bit count value from said up-down counter, the first resultant value multiplied by a first predetermined ratio, and the second resultant value multiplied by a second predetermined ratio, and outputs the n-bit digital data signal as a result of the addition.

5. An A/D converter according to claim 4, further comprising,
- a clock signal generator that generates a clock pulse signal, the clock pulse signal being used to synchronize digital integration processing in said digital integrator circuit,
- a plurality of clock pulse signal input terminals disposed for said up-down counter, said first adder, said second adder, and said third adder that receive the clock pulse signal from said clock signal generator, said plurality of clock signal input terminals receiving the clock pulse signal to execute count processing of said up-down counter and adding processing of said first adder, said second adder, and said third adder at timing synchronized with the clock pulse signal from said clock signal generator.

6. An A/D converter circuit according to claim 4, wherein said first adder outputs a LSB, said second adder outputs a first bit signal with higher bit than the LSB, and said third adder outputs a second bit signal with higher bit than the first bit signal.

7. An A/D converter circuit according to claim 6, wherein said first bit signal and said second bit signal are determined from said first and second predetermined ratio.

* * * * *